United States Patent
Lequesne et al.

(10) Patent No.: US 7,095,206 B2
(45) Date of Patent: Aug. 22, 2006

(54) SWITCHED RELUCTANCE MOTOR CONTROL WITH PARTIALLY DISABLED OPERATION CAPABILITY

(75) Inventors: Bruno P. B. Lequesne, Troy, MI (US); Suresh Gopalakrishnan, Sterling Heights, MI (US); Avoki M. Omekanda, Rochester, MI (US); Thomas Wolfgang Nehl, Shelby Township, MI (US)

(73) Assignee: Delphi Technologies, Inc., Troy, MI (US)

( * ) Notice: Subject to any disclaimer, the term of this patent is extended or adjusted under 35 U.S.C. 154(b) by 213 days.

(21) Appl. No.: 10/854,026

(22) Filed: May 26, 2004

(65) Prior Publication Data

US 2005/0264254 A1 Dec. 1, 2005

(51) Int. Cl.
*H02P 23/00* (2006.01)
*H02P 25/00* (2006.01)
*H02H 3/00* (2006.01)

(52) U.S. Cl. ............... 318/701; 318/696; 318/700; 318/727; 318/254

(58) Field of Classification Search ............ 318/254, 318/439, 700, 701, 727, 696, 437; 361/31; 363/56.03
See application file for complete search history.

(56) References Cited

U.S. PATENT DOCUMENTS

| | | | | |
|---|---|---|---|---|
| 4,896,088 A * | 1/1990 | Jahns | ............... | 318/696 |
| 4,896,089 A * | 1/1990 | Kliman et al. | ............ | 318/701 |
| 5,517,102 A * | 5/1996 | Jensen | ............... | 318/701 |
| 5,708,576 A * | 1/1998 | Jones et al. | ............ | 363/56.03 |
| 5,737,164 A * | 4/1998 | Ferreira et al. | ........... | 361/31 |
| 5,841,262 A * | 11/1998 | Tang | ............... | 318/701 |
| 5,850,133 A * | 12/1998 | Heglund | ............ | 318/700 |
| 5,892,348 A * | 4/1999 | Norman et al. | ........... | 318/701 |
| 6,020,711 A * | 2/2000 | Rubertus et al. | ........... | 318/701 |
| 6,949,908 B1* | 9/2005 | Maslov et al. | ............ | 318/727 |
| 6,972,533 B1* | 12/2005 | Jordison et al. | ........... | 318/254 |
| 2005/0073273 A1* | 4/2005 | Maslov et al. | ............ | 318/437 |
| 2005/0077862 A1* | 4/2005 | Jordison et al. | ........... | 318/701 |

OTHER PUBLICATIONS

Stephens, "Fault Detection and Management System for Fault-Tolerant Switched Reluctance Motor Drives," IEEE Transactions on Industry Applications, vol. 27, No. 6, Nov./Dec. 1991.

(Continued)

*Primary Examiner*—Paul Ip
(74) *Attorney, Agent, or Firm*—Scott A. McBain

(57) ABSTRACT

Certain circuit faults in a phase of a multi-pole, switched reluctance, rotary electrical machine are detected; and the machine is selectively operated with a detected circuit fault when the nature of the fault permits continued operation of the phase and the operation of the phase is desirable. The fault may be one of certain short or open circuits in which at least one of the two current controlling electronic switches is operable to control phase current within predetermined limits. In the continued operation when a fault is detected, (1) the phase current is switched off earlier than it would be in the absence of the fault and/or (2) the maximum phase current is reduced compared with that permitted in the absence of the fault; and either or both of these modifications may be a function of motor speed. If the circuit fault adversely affects current control by an electronic switch normally controlling current level, another electronic switch is substituted for current control.

14 Claims, 5 Drawing Sheets

OTHER PUBLICATIONS

Sawata et al, "Fault Tolerant Operation of Single-Phase Generators," IEEE Transactions on Industry Applications, vol. 35, No. 4, Jul./Aug. 1999.

Sawata et al, "A Study on Operation Under Faults with the Single-Phase SR Generator," IEEE Transactions on Industry Applications, vol. 35, No. 4, Jul./Aug. 1999.

Nandi et al, "Condition Monitoring and Fault Diagnosis of Electrical Machines—A Review," Electric Machines & Power Electronics Laboratory, Department of Electrical Engineering, Texas A&M University, College Station TX 77843-3128 (1999).

* cited by examiner

SWITCHED RELUCTANCE MOTOR CONTROL WITH PARTIALLY DISABLED OPERATION CAPABILITY

TECHNICAL FIELD

The technical field of this invention is control of switched reluctance motors.

BACKGROUND OF THE INVENTION

The literature has long recognized that the switched reluctance (SR) motor is fault tolerant because it can continue operating and produce torque with one or more of its phases not functioning. For example, in U.S. Pat. No. 4,896,089 to Kliman et al, where various means are described to identify faults, the corrective action upon detecting a fault is "that the faulted motor phases are deactivated" (column 9, lines 49–50). See also "Fault Detection and Management System for Fault-Tolerant Switched Reluctance Motor Drives, by Charles M. Stephens, IEEE Transactions on Industry Applications, Vol. 27, No. 6, Nov/Dec 1991. The focus in the prior art, then, has been to construct SR drives with separate inverters, power supplies and electronics for each phase, thus allowing an easy disconnect of any particular phase, as in U.S. Pat. No. 5,708,576 to Jones et al.

In "Fault Tolerant Operation of Single-Phase Generators" by T. Sawata, P. C. Kjaer, C. Cossar, and T. J. E. Miller, published in IEEE Transactions on Industrial Applications, vol. 35, No. 4, July/August 1999, the authors discuss the fact that a particular phase may be made of several windings. If these windings are separately excited, one can remove excitation from one winding and continue operating the rest of that phase. A similar idea is proposed in. U.S. Pat. No. 5,517,102 to Jahns, where 2 inverters are used for each phase and, in case of a failure, one half of a phase is disconnected (that is, excitation to that phase is removed) while the other half continues working and provides half of the nominal torque from that phase. In U.S. Pat. No. 6,020,711 to Rubertus et al, an SR drive is shown where the various phases and poles can be reconfigured to minimize the impact of removing a faulty circuit. In all 3 cases cited in this paragraph (Sawata et al, Jahns and Rubertus et al), though, the faulty circuit is removed.

In U.S. Pat. No. 5,737,164 to Ferreira et al, the authors point out that, when an SR motor is designed such that each phase has 4 poles, then turning off only 2 poles can be damaging because the flux from the poles remaining in the on state will travel through the poles with the damaged winding. Their proposed solution is to turn off all windings aligned with a rotor pole associated with a fault. Therefore, they go beyond the previous prior art and disable not only the damaged windings, but other windings as well.

A particular problem occurs with a faulty SR motor at standstill. The torque produced by an SR machine is produced by each phase sequentially. Therefore, if one phase is fully disabled (disconnected, etc), there is no torque available for some angular positions, spanning an angle somewhat less than $360°/N_{ph} N_r$, where $N_{ph}$ and $N_r$ are the numbers of phases and rotor poles, respectively. Disabling a phase completely is an issue during starting if the rotor is in the wrong angular position.

This starting problem has also been recognized and addressed in the prior art. The authors of U.S. Pat. No. 4,896,089, cited above, point out that if a motor cannot move clockwise as desired, due to an open phase, then it is possible to first move the motor counterclockwise to some other position, from which it can be excited to move clockwise. In some applications, a small rotation in the wrong direction may be acceptable, but not so in others.

U.S. Pat. No. 5,517,102 to Jensen teaches that, when specially designed, some SR motors do not have any dead zone for starting. However, the design conditions are severely limiting; for instance, there must be a minimum of 5 phases, etc.

U.S. Pat. No. 4,896,088, cited above, suggests using two separate excitation circuits (inverters, etc) for each phase. For instance, each excites two separate windings. Then, in case of a failure, only one half of the phase is removed and, concerning starting, half the starting torque is still available in the "dead zone". This solution, however, is costly, and relies again on disabling the faulty circuits.

SUMMARY OF THE INVENTION

This invention is a method and apparatus for operating a multi-pole, switched reluctance, rotary electrical machine having a plurality of phase winding circuits, wherein each of the phase winding circuits has a pair of terminals for connection across an electric power supply to provide electric current through all of the phase windings therein, an electronic switch connected to each of the terminals to control connection of the connected terminal to the electric power supply, and a plurality of free-wheeling diodes creating inductive energy dissipating current paths. In the invention, electric power is provided to the pole phase windings of one of the phase winding circuits through the electronic switches thereof during a first motor movement distance in which inductance of the one of the pole phase windings is increasing and at least one motor parameter is monitored to detect at least one predetermined circuit fault comprising a short circuit or an open circuit of an element within the one of the phase winding circuits.

When the predetermined circuit fault is detected, the provision of power is modified by: (1) using at least one of the electronic switches to end connection of the phase winding circuit across the electric power supply at a first motor position prior to a second motor position at which the connection is ended in the absence of such detection, and/or (2) using at least one of the electronic switches to control maximum current through the phase winding circuit to a first maximum current level less than a second maximum current level permitted in the absence of such detection.

The circuit faults to which the invention is applicable include at least a short circuit of an electronic switch, a winding-to-winding short, a winding-to-ground short, a winding to power short, an open circuited parallel winding, and open free-wheeling diode and an open power supply capacitor.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
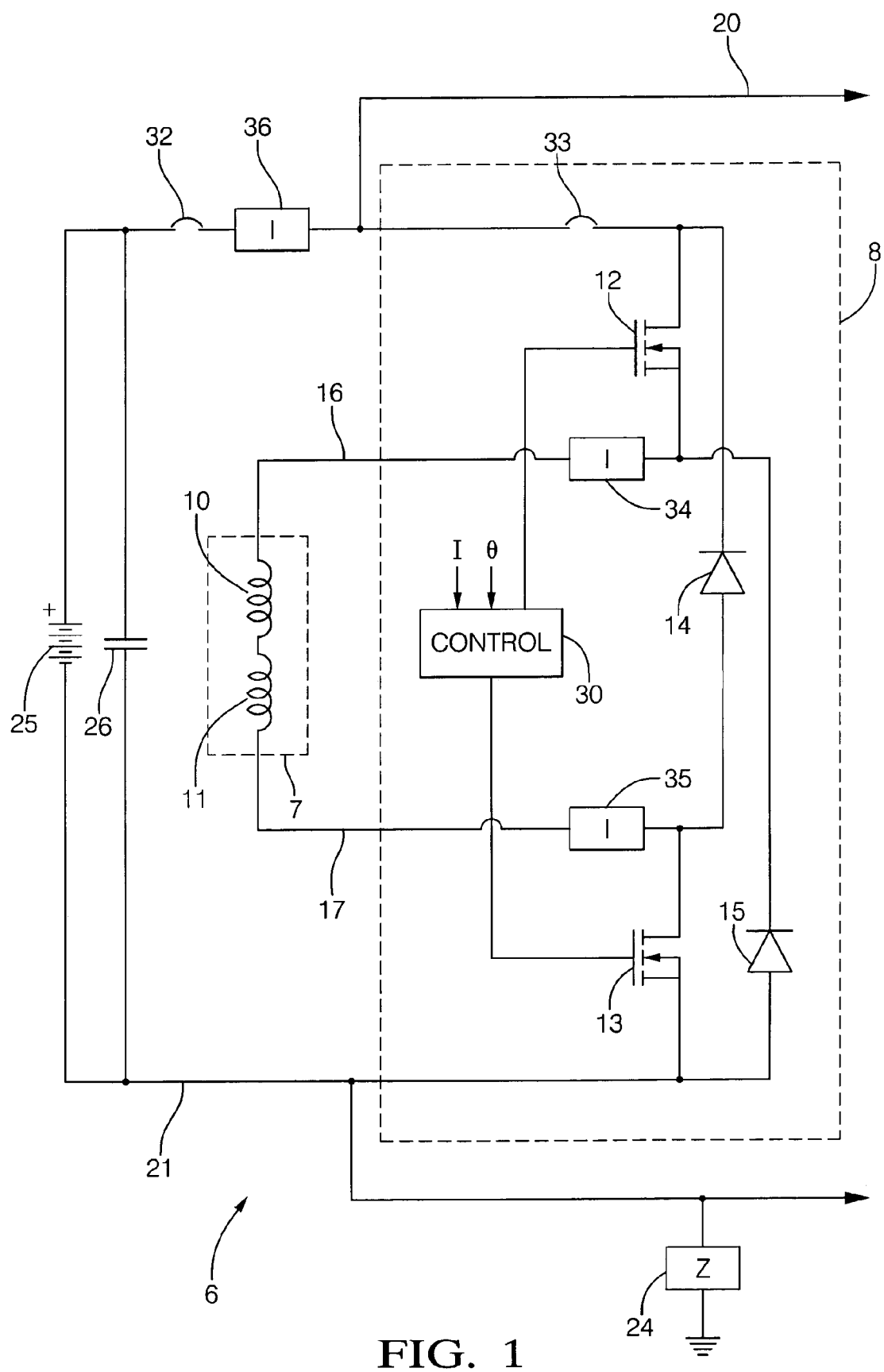
FIG. 1 is a circuit diagram of one phase of a bridge switching circuit for a switched reluctance electrical machine.

FIG. 1 shows a phase circuit 6 for one phase of a multi-phase, switched reluctance electrical machine, the circuit having a plurality of pole phase windings represented by, but not limited to, a typical embodiment of a series connected pair of pole phase windings 10 and 11 in the machine 7 itself and electronic switching components in a phase control circuit 8 in an inverter apparatus for controlling the current in windings 10 and 11. In this embodiment, the machine is considered to be a rotary machine in which the windings are wound on poles in a machine stator and a rotor includes magnetic members. In such an embodiment, the machine dynamic parameters (motor position, motor movement distance, motor speed, etc.) are most conveniently measured in rotary coordinates. But the invention is not limited to rotary machines; and in linear machines, the machine dynamic parameters would be measured in linear coordinates. The ends of windings 10 and 11 not connected to the other of the windings 10 and 11 are connected via leads 16 (winding 10) and 17 (winding 11) to a phase control circuit 8 so that the total phase current to windings 10 and 11, which represent all windings in the phase, passes through leads 16 and 17. The end of winding 10 opposite that connected to winding 11 is connected through an electronic switch 12 to a first (positive, e.g.) power supply rail 20; and the end of winding 11 opposite that connected to winding 10 is connected through an electronic switch 13 to a second (negative, e.g.) power supply rail 21. Switches 12 and 13 may be MOSFETs, IGBTs or other appropriate electronic switches known in the art. A diode 14 is provided from the junction of the terminal of switch 13 adjacent winding 11 to the terminal of switch 12 adjacent the first supply rail 20 so as to permit circulating currents to dissipate inductive energy of the windings when switch 13 is switched from an activated to a deactivated state; and a similar diode 15 is connected from the terminal of switch 13 adjacent the second supply rail 21 to the terminal of switch 12 adjacent winding 10 for the same purpose when switch 12 is similarly switched. Electronic switching components 8 are joined by similar groups in parallel between supply rails 20 and 21 to control phase windings similar to windings 10 and 11 in each of the other phases of machine 7. These additional groups of switching components are essentially identical in structure and operation to those of group 8 and are thus not separately shown or described. First supply rail 20 is connected to a first (+) terminal of a DC power supply 25, preferably through a circuit breaker 32 as shown; and a second supply rail 21 is connected to a second (−) terminal of power supply 25. A smoothing capacitor 26 may be connected across power supply 25 as shown. A circuit breaker 33 may be provided for protection of electrical components within the phase, for example connected between first supply rail 20 and electronic switch 12 as shown and controlled by control 30 in response to detection of a short within the phase that prevents phase operation. An impedance 24 is shown between the second supply rail 21 (ground of the inverter circuit) and machine 7 ground. Current sensor locations 34, 35 and 36 are also illustrated in this diagram and will be explained at a later point in this description along with control 30.

Electric current through windings 10 and 11 is controlled by activation and deactivation of electronic switches 12 and 13. These switches, as well as the corresponding switches for the other machine phases, are controlled by a machine drive control module 30, which receives a machine position signal (in this rotary machine embodiment, a rotor angular position signal) θ, either directly from a position sensor, not shown, or indirectly from a "position sensorless" algorithm as known in the art. The sensed current signal may be used as a current feedback signal in current magnitude control and additionally in the sensing of certain short circuits. The machine position signal may be used to indicate which phase is to be activated and in the determination of when to activate and deactivate current within the indicated phase.

Inverter 8 is typically housed near but separated from the windings of machine 7. Windings 10 and 11 are connected to the inverter by leads 16 and 17, respectively, which thus constitute terminals of the phase winding circuit comprising all the phase windings within circuit 6. These leads may be as short as 1 inch if the converter is integrated inside the machine, or as long as one to several feet otherwise. The circuit arrangement shown in FIG. 1 is the most common drive for this type of motor. It is particularly suitable for applications where a higher degree of robustness and fault tolerance is expected, for example in steer-by-wire or brake-by-wire automotive systems. By and large, the principles presented herein may be adapted to some of the other inverter configurations used to drive switched reluctance motors.

Circuit 6 can be excited using either one of three control modes. The first of these three modes is voltage mode, in which both switches 12 and 13 are turned on for a predetermined amount of time. Voltage mode is used at higher speeds, or at low speed with some means to control (lower) the voltage. The other two control modes use current control, wherein the switches are first turned on, then on and off in such a way as to keep the current level approximately constant, due to the inherent inductance of the windings. Current control can be implemented in either one of two ways: hysteresis control or PWM control. In hysteresis control, the second of the three modes, the current is turned off when the current reaches a certain level, and turned on when it goes below some other predetermined level. In PWM control, the third of the three modes, the current is turned on in a commanded pulse width modulation dependent on sensed current level. Either of these current control modes may be referred to as current mode.

In current mode, usually one switch is turned on for the duration of the phase conduction period while the other switch is alternately turned on and off to control the current. The former switch will be denoted the "ON switch", and assumed to be, without loss of generality, the upper switch (12) in FIG. 1. Similarly, the latter switch will be denoted the "PWM switch", and assumed to be, without loss of generality, the lower switch (13) in FIG. 1. The phase is deactivated by turning off the PWM switch (13 in the example). The windings in each phase of the machine are activated through predetermined machine movement distances (in this embodiment, phase angles) by control 30 to produce smooth machine motion at a desired output torque (for rotary machines) or force (for linear machines). In the case of a three phase, six/four rotary machine (that is, six stator poles and four rotor poles), for example, each phase is activated four times during each machine rotation, through a predetermined phase angle while inductance is increasing in the windings of the phase.

Figure 2A:
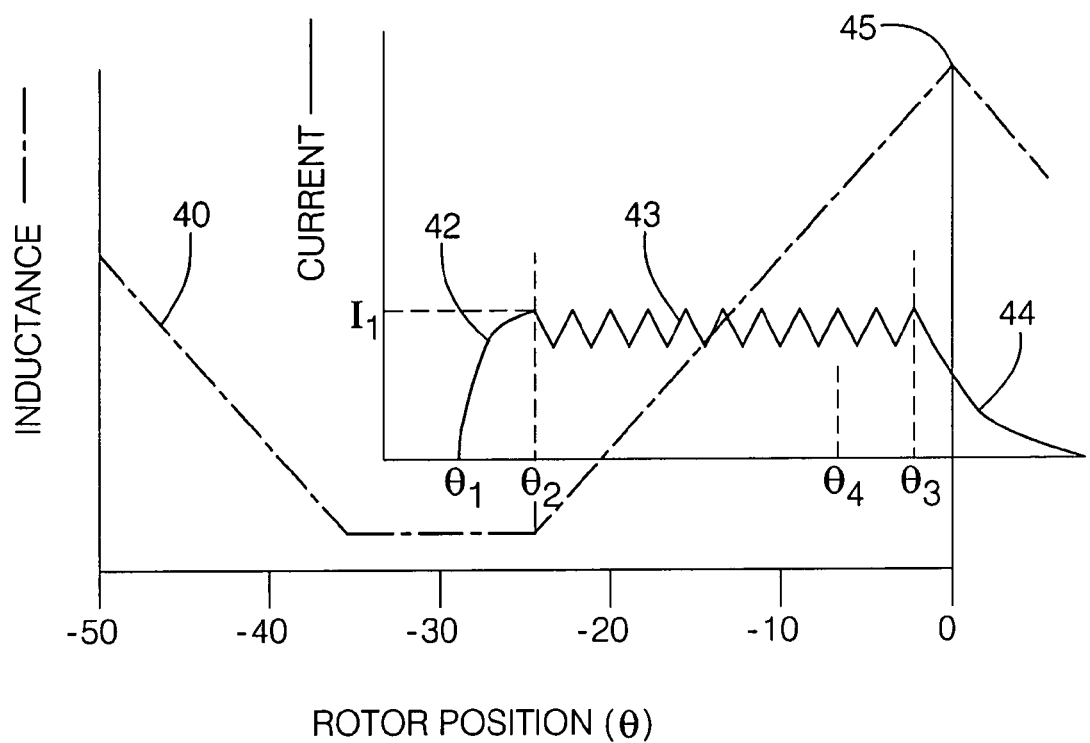
FIGS. 2A and 2B combine plots of inductance and current as a function of rotor angle in the pole phase winding shown in FIG. 1, the plots of the figures differing in the turn-off angle and the current level provided.

The basic method of switch control of switched reluctance motors can be understood with reference to the phase inductance profile, which is shown in FIG. 2A. The phase inductance is periodical, with the period equal to 360° divided by the number of rotor poles. As illustrated in FIG. 2A for motoring mode, a phase current is turned on ($\theta_1$) in each pole winding when the inductance is low and turned off ($\theta_3$) near and prior to the phase inductance peak. The turn-on position (in this embodiment, angle) $\theta_1$ is selected such that the rising current, designated by line 42, reaches a desired level at the beginning ($\theta_2$) of rising inductance, as shown in line 40. The current is continued at the desired level through this motor distance wherein inductance is rising and creates aiding torque that keeps the rotor turning. In current mode, the current is chopped on and off between overall turn-on and turn-off angles to control its level, as shown line 43. If the current is still flowing through the phase winding beyond the inductance peak (rotor position 0), some regeneration (negative torque with positive speed) occurs due to the falling current, represented as line 44, as the torque turns negative on the following side of the peak. If the current is not turned off, either intentionally or as a result of a fault, the current may increase as mechanical energy is fed back into the electrical system. In normal operation, when there is no fault, a small amount of regeneration (negative torque) can be allowed as the inductively driven current ramps downward; and the current control is designed to initiate the end of current flow in each phase at some optimal position ($\theta_3$) prior to the inductance reversal of the phase, so that a desired optimal balance is obtained between loss of aiding torque through early turn-off and undesired negative torque through later turn-off. But if a short circuit occurs, the current and its resultant inductive energy may build up, significantly increasing the amount of regeneration and extending its duration into the next phase. Thus, the method and apparatus of this invention are designed to apply a special fault control to the current in a controllable faulted phase to prevent such a build up, by (1) advancing the angle of current turn off (turning off earlier) to allow for a more extended ramp down period before the inductance peak of the phase and/or (2) limiting the maximum current level to a lower level before the current turn off to avoid large current surges.

Figure 3:
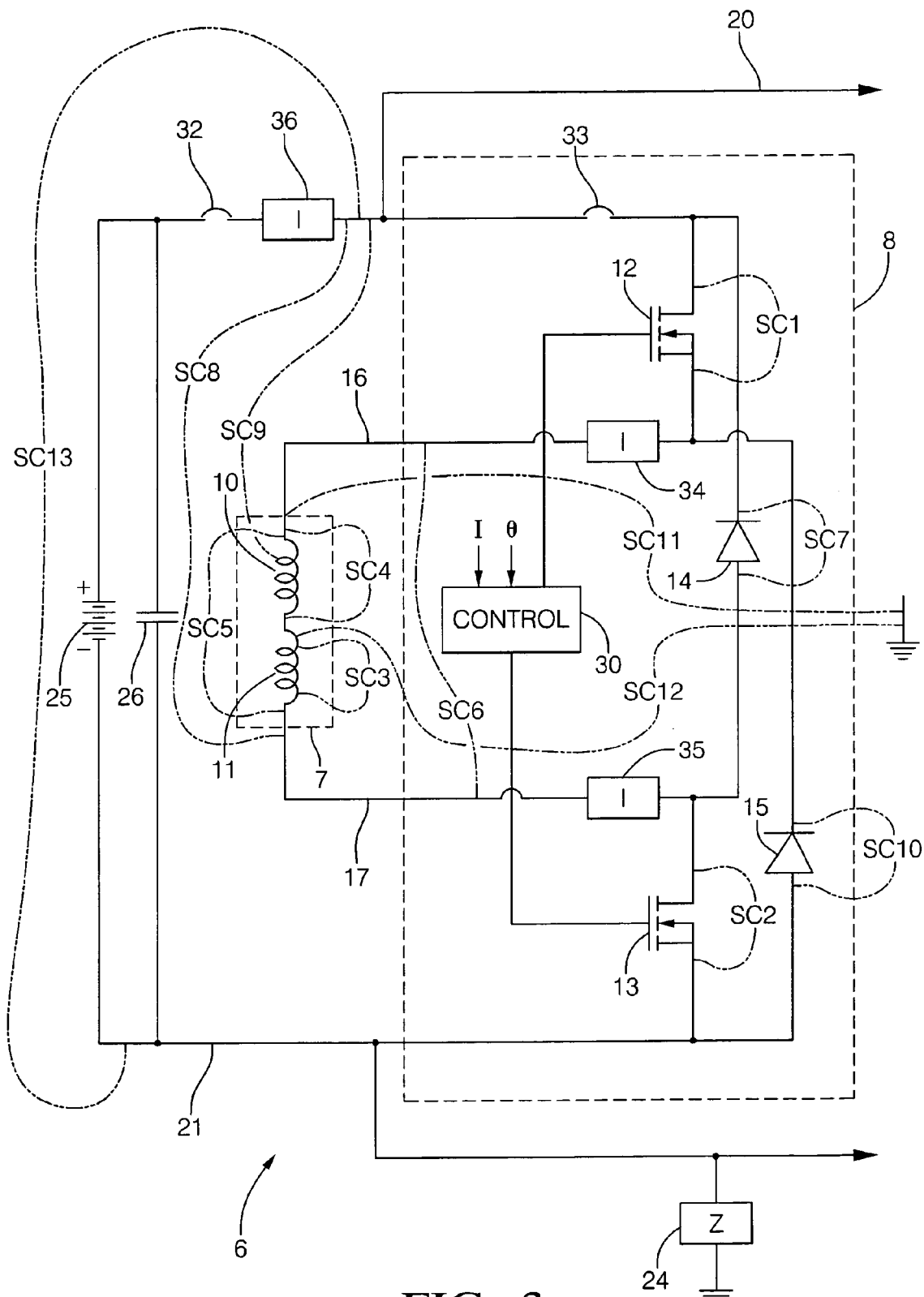
FIG. 3 is a circuit diagram illustrating possible short circuits in the circuit of FIG. 1.

Short circuits may occur between any two wires that are in close proximity or between any point and ground. The distinct types of short-circuits that can be identified are denoted in FIG. 3 as the alternating dot-dash lines referred to as SC1 to SC13, respectively. SC1 indicates a short of ON (upper) switch 12; and SC2 indicates a short of the PWM controlled (lower) switch 13. Each of these shorts is indicated as bypassing the switch, but this representation also includes the more common internal switch short, which has essentially the same effect. SC3 indicates a partial short of a phase winding, and SC4 indicates a full phase winding short. Although each of these shorts is shown with respect to a single winding to avoid clutter in the figure, each can occur in either winding. SC5 indicates a full phase winding short within the machine, and SC6 indicates a full phase winding short within the inverter (distinguished by the location of the current sensor used for sensing the short). SC7 indicates a short of diode 14. SC8 indicates a short from (power) supply rail 20 to a machine phase bypassing all phase windings (but not PWM switch 13), and SC9 indicates a short from supply rail 20 to a machine phase bypassing part of the phase windings. SC10 indicates a short of diode 15. SC11 indicates a short from (ground) supply rail 21 to a machine phase bypassing all phase windings (but not ON switch 12), and SC 12 indicates a short from ground to a machine phase bypassing part of the windings. SC13 is a direct power to ground short (e.g. between supply rails 20 and 21).

Not all of these possible short circuits provide opportunity for the advantages of this invention. In particular, for SC7, SC10, SC5, SC6, SC11 and SC13, there is no solution other than to do as the prior art suggests, namely, disable the affected phase. This is because in all these cases the machine windings are completely by-passed by the short-circuit. There is therefore no way to obtain any output (torque) from that particular phase. Disabling the phase is also recommended to avoid further damage to the system. For instance, in cases SC7 and SC10, turning on switch 13 or 12 will lead to its destruction by high currents, and this should be avoided.

Cases SC8 and SC9 are seen as extremely unlikely and will not be considered further. In addition, phase-to-phase short-circuits, not identified above, can be avoided with simple lay-out precautions, and are therefore not considered further. Finally, it can be shown that short circuits SC3 and SC4 (partial winding and full winding short circuits, respectively), have similar effects, therefore they will be considered together as a single case.

Thus, in cases SC1, SC2, SC3/SC4, and SC12, at least partial operation is possible; and such operation is an object of this invention. Detailed remediation schemes of three types will be presented in this description.

The first type of remediation scheme is early turn-off to avoid negative torque. In SR motors, the current is turned on when the phase inductance is low and turned off before the phase inductance peaks (see FIG. 2A). If the current is still on after the peak, a negative torque is produced. During normal operation, this may be acceptable because the small negative torque is more than offset by the positive torque produced before the peak. But in the presence of a short-circuit, the current may be difficult or impossible to control and a larger negative torque may thus be produced. For some of the short-circuit scenarios, it is therefore advisable to turn the current off early. The generation of current after the peak in phase inductance is due to the presence of an electromotive force (EMF) in the coils and is therefore speed dependent. The degree of turn-off advance should thus be speed dependent, with marginal or even no advance at zero and low speed and increased advance with increased speed.

The second type of remediation scheme to be considered is lower maximum current. Short-circuits tend to produce large currents limited only by voltage and resistance. Because of the presence of a phase inductance, however, the current rise rate is limited. Therefore, it is possible under some circumstances to provide some control of the current by frequent on/off switching. Alternatively, a lower value of maximum current may be used to avoid large current surges. The lower maximum current may further be achieved through any of the following three control actions: (a) lower maximum current command (for instance with hysteresis current control); (b) successive turn-on and turn-off angles at higher frequency; and/or (c) reduced voltage level.

The third type of remediation scheme to be considered is exchanging respective roles of ON and PWM switches. In normal operation, assigning the role of ON and PWM switch to switches 12 and 13 is arbitrary, because the drive is symmetrical. However, in the presence of a fault, this symmetry may be broken. There may then be an advantage or a need to specifically assign the role of PWM switch to either switch 12 or 13. In particular, if one of the switches is shorted and the other is not, the shorted switch acts essentially as an ON switch; and the other switch is assigned the role of the PWM switch to control the current level, regardless of the switch assignment prior to detection of the short circuit.

Following is a detailed description of the handling of each type of short circuit:

Short-circuit SCI: ON Switch 12 is Short-circuited

This type of short-circuit leads to normal looking currents when the phase is supposed to be on, followed by a large current surge after the phase should have turned off. This current surge is due to the fact that there is still some current in the phase after the phase inductance has peaked, and it is fueled by the machine back-EMF. It is therefore larger at higher speed. Early turn-off is therefore the strategy of choice for this situation. The higher the speed, the earlier the turn-off. At low speed and especially for starting, when the back-EMF is still very small, only minimal or even no early turn-off may be necessary. Reducing the current level is not necessary in this case, though it may be also used as a precaution.

Short-circuit SC2: PWM Switch 13 is Short-circuited

The short-circuited switch cannot be turned on and off to control the current. It is therefore necessary to first exchange the roles of the ON and PWM switches. That is, switch 12 becomes the PWM switch. Then, we are in the same situation as with SC1 with early turn-off as a solution.

Short-circuit SC3/SC4: Partial Winding Short-circuit

The analysis of a partial winding short circuit must distinguish between current mode with hysteresis control, on the one hand, and voltage mode control and current mode with PWM mode control, on the other hand.

In current mode with hysteresis control, the average current level remains essentially the same despite the shorted turns, since the switching depends on current level. The phase produces less torque (the more turns are shorted, the smaller the torque). However, continued operation is possible. Because of a reduced current rise time constant, the current band may be larger than normal, therefore the current may exceed its maximum value. This is particularly true if the current level is software controlled (as opposed to hardware control). It is therefore prudent to lower the maximum current allowable in the phase. Also, the shorted windings may be magnetically energized at the end of the magnetization period. It is therefore important to use an early turn-off strategy to avoid negative, generating torques to be produced after the normal phase conduction period. The higher the speed, the earlier the turn-off. At low speed and especially for starting, when the back-EMF is still very small, only minimal or even no early turn-off may be necessary. In that mode, the proposed remediation strategy is lower maximum current (some 10% to 20% lower) and early turn-off.

In voltage mode control and PWM mode control, the current in the faulty phase is larger than normal. The greater the percentage of shorted turns, the larger the current. The simplest remedy consists of switching to current mode with hysteresis control, and then using the above proposed remedies. However, this requires the presence of a current sensor. Therefore, other remedies are proposed, all aimed at reducing the current level. In summary, either (1) switch to current mode, hysteresis control, and apply corresponding remedies, if possible, or (2) apply early turn-off to avoid negative torque, together with lower maximum current achieved with successive turn-on and turn-off angles at higher frequency and reduced voltage level.

SC12: From Ground to Phase, Including Part of Winding

SC12 is equivalent to SC2 and SC3/4 combined. It is first necessary to make switch 12 (switch connected to $+V_{dc}$ bus) the PWM switch. Then, assuming that current mode with hysteresis control is possible, the solution consists of the same solutions as with both SC2 and SC3/4, namely: lower maximum current (some 10% to 20% lower) and early turn-off. However, in some cases current control with hysteresis may be impractical. This is the case in particular if the needed current sensor is part of the circuit branch being shorted. It is also the case if the system does not have a current sensor, for instance if the machine is always controlled in voltage mode. Then, the solutions are (1) early turn-off to avoid negative torque, and (2) lower maximum current achieved with successive turn-on and turn-off angles at higher frequency and reduced voltage level.

Figure 4:
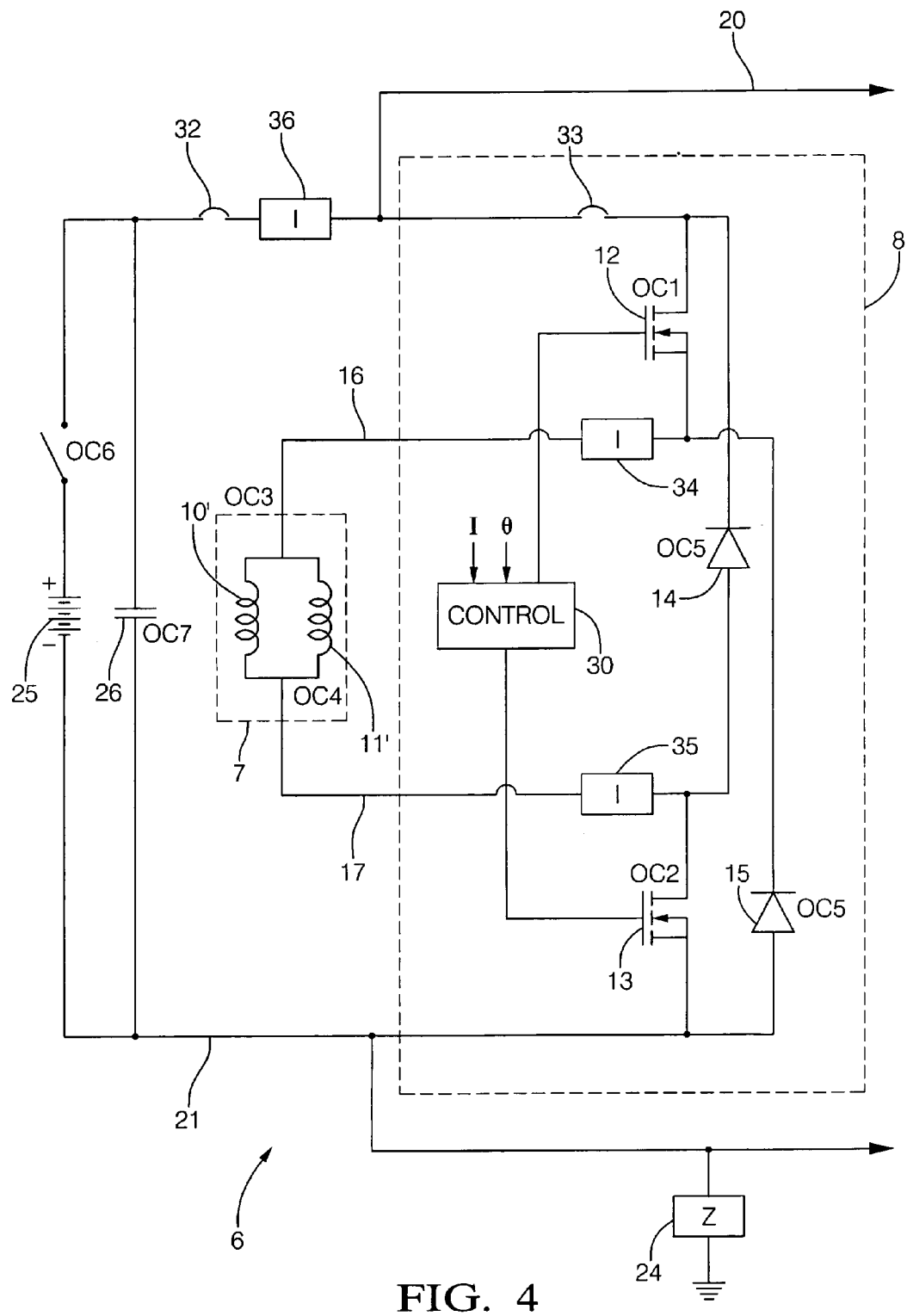
FIG. 4 is a circuit diagram showing the placement of current sensors

An open circuit is another type of fault that may occur in various locations in the circuit. All told, though, one can define 7 distinct types of open circuits, denoted OC1 to OC7 next to the affected circuit element in FIG. 4. OC1 is an open ON switch 12. OC2 is an open PWM switch 13. OC3 is an open circuit in series connected windings or all parallel connected windings within a phase, so that the entire phase is open circuited. OC4 is an open circuited winding in parallel connected windings in a phase. OC5 is an open diode 15 or 14. OC6 is an open power switch (no power from power source 25). OC7 is an open power supply capacitor 26.

For OC1, OC2, and OC3, operation of the faulted phase is clearly impossible, since the phase has disabled itself. In case OC6, with no power, the entire machine is disabled. But in cases OC4, OC5 and OC7 continued operation is possible, as will be described below. The consideration will begin with a review of various remedial strategies proposed herein. Then we will examine each open circuit type and comment as to which of these remedial strategies is appropriate for this particular situation.

Remedial strategies for open circuits are available in the three types discussed above for short-circuit faults, namely: (1) early turn-off to avoid negative torque; (2) lower maximum current achieved with either: (a) lower maximum current command (for instance with hysteresis current control), (b) successive turn-on and turn-off angles at higher frequency, and/or (c) reduced voltage level; and (3) Switch respective roles of ON and PWM switches. An additional type applicable to case OC7 is (4) avoidance of regeneration mode (let the motor coast down instead of actively braking the motor).

OC4: Open Winding, Parallel Connection

When the phase windings are connected in parallel, the current in the healthy parts of the phase will increase when one of the circuits is open, since the entire demanded current is routed through fewer windings in parallel. The current density in the healthy windings may thus go beyond safe levels. Continued operation is possible, but the maximum current levels must be reduced. The proposed remedy thus consists of lower maximum current achieved with (a) lower maximum current command (for instance with hysteresis current control), (b) successive turn-on and turn-off angles at higher frequency and/or (c) reduced voltage level. Early turn-off is not necessary in this case as it is in some short-circuit situations.

OC5: Diode Open Circuit

If a diode is open, normal current conduction in the phase can occur until the switches must be turned off. If they are turned off while the current is non-zero, that is, as there still is magnetic energy in the winding, there is no path for the remaining energy to dissipate. Consequently, damage to one or both of the switches is to be expected. But continued operation is possible with precautions aimed at bringing the current to zero before turning the switches off. In particular, it is important to make sure the currents are zero before the peak in phase inductance, because they would rise again under the influence of power generation, and could not be extinguished. It is thus important to use an early turn-off strategy.

The level of turn-off angle advance depends on the current level, since the goal is to make sure the current reaches zero before the peak in phase inductance. If lower currents are used, then the level of turn-off angle advance can be reduced. One may therefore prefer to deliberately reduce the current level to help ensure that the current disappears when needed. These remedial strategies are also speed dependent. At low speed, there is more time for the current to coast to zero before the inductance reaches its peak, therefore the advance in turn-off angle may be small. With increased speed, the advance must be larger.

Assuming only one diode is open, say diode 15, then switch 13 can still be turned on and off as the winding energy can still circulate via the healthy diode 14. However, switch 12, in parallel with the open diode 15, can never be turned off until the current is zero. Switch 12 must therefore be the ON switch while switch 13 can be the PWM switch. Therefore, the roles of the two switches may need to be changed, so that the switch in parallel with the open diode is the ON switch, and the other switch is the PWM switch.

In summary, the proposed remedy is early turn-off, with possibly a lower current command. Switch respective roles of ON and PWM switches, if needed, so that the switch in parallel with the open diode is the ON switch.

OC7 Open Power Capacitor

The role of the capacitor consists of providing peak current when needed. It stores energy when the motor regenerates. Overall, it reduces voltage ripple and protects the inverter, as well as other electronic circuits directly or indirectly connected to the motor drive. If the capacitor is open and peak current is needed, the motor will produce reduced torque, but no further damage will take place. Some voltage ripple, larger than normal, should be expected as well.

Concerning energy storage, operating the motor in regenerating mode must be avoided. The current must be turned off by turning off only one of the two switches, not both. The last turn-off must thus take place early enough to avoid operating beyond the inductance peak, where regeneration will occur. Finally, the motor cannot be slowed down by active braking, and must be allowed to coast down before direction of motion is reversed.

Operation should thus be limited to emergencies, such as starting or particular need for extra torque, but it is possible with the possible strategies of (a) early turn-off, (b) no turning off of both switches until current is zero and (c) no negative torque command when the speed is positive. While not strictly necessary, it may be advisable to work at reduced current levels to minimize the energy stored in the machine.

Figure 5:
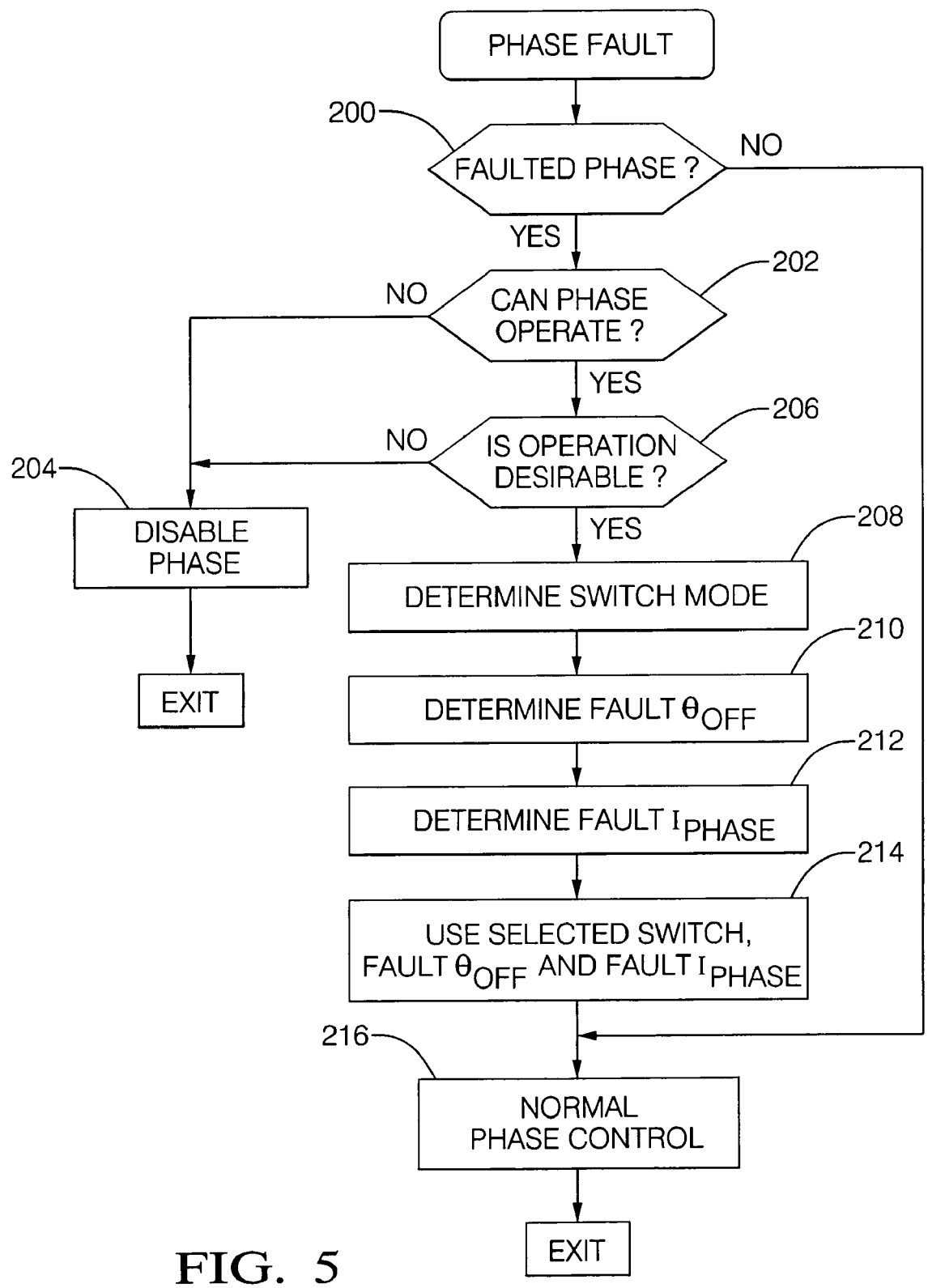
FIG. 5 is a flow diagram of a process for controlling current in the pole phase winding shown in FIG. 2.

The flow chart of FIG. 5 describes a process PHASE FAULT, which is preferably performed under control of a programmed digital computer. The flow chart as shown illustrates the process in its general form and will first be described with respect to the detection and amelioration of faults SC1 or SC2 (shorted switch), which is the most likely fault encountered in typical operation. The process begins at step 200 by determining if a phase is faulted, by whatever means are known for determining the particular fault or faults being monitored. A short of the ON switch 12 (SC1) will still permit current control by the other (PWM) switch 13 during activation of the phase, since it would be conducting for the duration of phase activation anyway; and it thus would be difficult to detect during this period. But when the control attempts to turn off both switches 12 and 13 at the end of the motor movement distance for the phase (angle $\theta_3$ in FIG. 2A), shorted switch 12 will continue to conduct inductively generated current in the loop of windings 10, 11, diode 14 and shorted switch 12. The resulting current surge may be detected with a current sensor in either of locations 34 and 35. A short of PWM switch 13 will be detectable with either of the same current sensors at an earlier point ($\theta_2$) in the phase activation, as the current continues to rise due to the fact that the PWM switch cannot limit conduction. In addition, or alternatively, in the case of machines in only occasional use (e.g. vehicle steering or braking actuators), the switches may be periodically tested when not in use by turning on both switches and turning off each by itself (all for durations sufficiently short to avoid damage to the electronics or unacceptable machine operation) to determine that each switch is capable of limiting current flow.

If no fault is determined for the phase in step 200, the process proceeds directly to the normal phase control process at step 216 and eventually exits. But if a fault is determined at step 200, the process next determines at step 202 if the phase can be operated. This determination will depend on what type of fault has been detected. In the case of either of faults SC1 and SC2, such operation is possible, since either of the shorts is essentially equivalent to a switch in a permanently on condition and it requires both switches in series to close the circuit including the windings and the power source. In fact, if these are the only faults being detected for partial operation, this step may be judged to be superfluous and omitted. But in a more general case wherein a number of different faults are detected, this step may be required to distinguish between those that permit continued operation of the phase and those that do not. If the fault is one of the latter, in which no further operation of the phase is possible, the process proceeds to disable the phase at step 204 before exiting.

If the faulted phase is found at step 202 to be of the type permitting continued operation, the process next determines at step 206 whether such operation is desirable. This is a design decision made by the machine designer and programmed into the process. The decision may call for additional data, such as an indication whether the motor is in a starting mode or in low speed operation, in which the back electromotive force in the phase is small and continued operation of the phase can provide significant benefit with little disadvantage, as opposed to high speed operation, where the degree of turn-off advance required may be so great that little benefit in torque or smoothness of output is realized from continued operation of the phase. If the determination is that continued operation is not desirable, the process proceeds to disable the phase at step 204 before exiting. But if continued operation is desirable, as in the cases of faults SC1 or SC2 in which no significant winding shorts have significantly reduced the torque capability of the phase, it is likely that continued operation of the phase is desirable. As in the previously described step 202, if SC1 or SC2 are the only faults being detected for partial operation, this step may be judged to be superfluous and omitted. But in a more general case wherein a number of different faults are detected, this step may be required to distinguish between those in which continued operation of the phase is desirable and those in which it is not.

If the determination at step 206 is that continued operation of the faulted phase is desirable, the process proceeds to determine at step 208 if the controlling switch needs to be changed. If the fault is SCI, in which switch 12 (the ON switch) is shorted, the short circuit essentially simulates a turned on switch 12 that would be turned on anyway; and switch 13 (the PWM switch) is capable of performing its normal current control function. Thus, no role reversal of the switches is required; and switch 13 is the continuing switch. But if the fault is SC2, switch 13 (the PWM switch) cannot control current flow. As long as switch 12 is capable of performing the current control function, continued phase operation may be obtained by reversing the role of the switches in the faulted phase so that switch 12 becomes the continuing, PWM switch in place of switch 13.

When the proper electronic switch (12 or 13) has been selected as the switch for current control in continuing operation, a fault motor position comprising, in this embodiment, an advanced turn-off angle FAULT $\theta_{OFF}$ is derived at step 210. This angle will be a function of motor rotational speed:

$$\text{FAULT}\theta_{OFF} = F1(\text{SPEED}_{MTR})$$

Figure 2B:
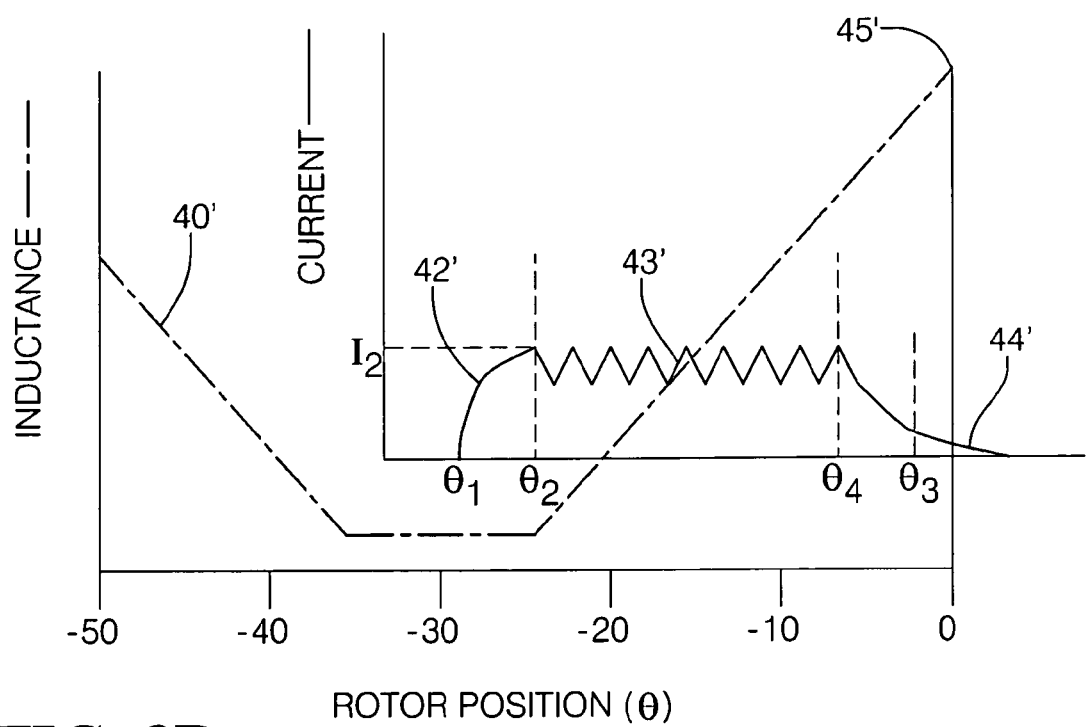

Calibrated values for varying motor speed may be stored in a look-up table. They will typically increase with motor speed, and may be zero at motor start and very low speeds. The result of the advanced turn-off angle can be seen by comparing FIG. 2A with FIG. 2B. FIG. 2A illustrates current in the phase when no circuit fault is detected. After an initial rise with both switches conducting, shown as segment 42, and a period of PWM controlled current shown as segment 43, the switches are both turned off at a no-fault motor position $\theta_3$, after which the current falls while the inductive energy dissipates. FIG. 2B illustrates that segment 43' ends at a fault motor position $\theta_4$, which is in advance of (i.e. earlier than or prior to) angle $\theta_3$. This begins the dissipation of inductive energy earlier with reference to peak 45' of the inductance curve 40', so that the current in segment 44' falls to a lower level at peak 45' than it would have with turn-off at angle $\theta_3$.

Next, a lower, fault maximum level of phase current FAULT $I_{PHASE}$ is derived at step 212. This may also be stored in a look-up table and will typically provide zero or a small change at low motor speeds and increase with speed:

$$\text{FAULT}I_{PHASE} = F2(\text{SPEED}_{MTR})$$

The effect of this lower maximum phase current is also shown in a comparison of FIG. 2A and FIG. 2B, as the fault maximum phase current I2 of segment 43' is lower than no-fault maximum phase current I1 of segment 43 in FIG. 2A.

The assigned electronic switch determined at step 208, advanced turn-off angle derived at step 210 and maximum phase current derived at step 212 are assigned in replacement of the normal values stored in memory at step 214. The process then process proceeds to step 216 using these values in the normal phase control. If desired, and if conditions permit, selected other phases may be adjusted to compensate for the reduced torque contribution from this phase.

The torque produced by the faulted phase in continued operation is typically less than that produced by the other phases, due to the shorter angular duration of the current and its lower average value; and the decision in step 206 as to the desirability of continued operation of the phase is made by the system designer will depend in part on the question of whether lower torque is worth any negative consequences of continued operation. One mode of operation in which it generally is useful is in motor starting. In some motor designs, the motor cannot be started unless torque is produced in one of the phases, the particular phase required being determined by the particular angular relationship between rotor and stator at the time of starting. In such a case, any torque sufficient to change the angular position of the rotor with respect to the stator is most welcome to initiate motor operation. In addition, in such a situation, motor speed is zero or extremely low, so that damage to circuit components or machine windings in the faulted phase from overcurrent or similar effects are unlikely. The phase can be turned off, if this is considered prudent, after the motor has gained sufficient speed to operate on the remaining phases.

The process PHASE FAULT is applied to each phase for control of its activation as a function of rotor position, with periodic adjustments made as required during successive repetitions of a the process during each phase. It may be applied to most of the other short and open circuit faults described above, with whatever differences in fault detection or switch control being stored as additional program code and/or data.

In the case of SC3/SC4 different control modes require different fault detection methods. In current mode with hysteresis control, the current levels measured in the location of either sensor 34 or sensor 35 will be normal, since the switching is controlled by current level and switches 12 and 13 are operating normally. But the output torque for the faulted phase will be low, as compared with the other phases. Generally, the greater the number of shorted winding turns, the greater will be the loss of torque from the phase. The system designer would define torque difference reference data that would be stored in system memory for the use of the control in detection of the fault. The torque for the phases may be measured by any suitable, known method not depending on current sensing. For example, motor speed (derived by differentiating the motor position sensor signal $\theta$ or from a separate motor speed sensor) may be used to detect telltale periodic speed variations indicative of lower torque from one motor phase, and the low torque phase may be identified by referencing the output of position sensor signal $\theta$ associated with the speed variations. One may alternatively use a flux differential detector, as described in the Charles M. Stephens article referenced in the Background section of this document, to detect the shorted phase. In the case of voltage mode or current mode with PWM control, the current as measured by either of sensors 34 and 35 is increased relative to the other phases, and current difference reference data may be stored in memory for use in the detection.

The case of SC12 is essentially equivalent to a combination of both SC2 and SC3/SC4, since both switch 13 and a portion of the phase windings are bypassed by the current flow to ground. The detection thus requires a combination of the detection techniques for those faults as described above appropriate to the control mode, with the current sensor location of choice being sensor 34. Sensor location 34 is desirable because it will conduct fault indicating current for the largest number of different short circuit faults. In particular, circulating currents resulting from a switch short circuit (SC1, SC2) or currents from this winding short circuit to ground (SC12) will be detectable. Likewise, continued operation of the phase requires a combination of faulted phase operation techniques for those faults as described above. Since switch 13, normally the PWM switch, is out of the circuit, a change in switch function as previously described for short SC2 will be required. It may also be noted that, although fault SC9 is considered extremely unlikely, it is essentially equivalent to a combination of both SC1 and SC3/SC4 and could also be detected and controlled in continued operation by combinations of the techniques for those faults as previously described. The main differences from fault SC12 would be in the lack of necessity to change switch function in continued operation, since normal PWM switch 13 is still in the circuit, and in the choice of current sensor location 35 for detection purposes. Since fault SC9 is unlikely, at least much less likely than fault SC12, it follows that sensor location 34 is preferred overall.

Open circuit fault OC4, an open circuit in a parallel winding within the phase, effectively decreases winding turns without affecting switch operation. The danger is the increased current level in the good windings, which could exceed their capability, a fact that will not be immediately indicated by current sensors 34 and 35 since they measure total phase current, not the current in individual parallel windings. Thus the current situation appears similar to that of fault SC3/SC4, except that the current rise in any switching situation will be slower due to an increase in apparent inductance in the phase. This lower rate of current increase, as compared with the other phases, may be used to detect the condition. Continued operation may be possible by reducing maximum current level in the phase to offset the increased current forced into the good windings, assuming that this does not reduce the machine output torque or unbalance the phase outputs to an unacceptable degree. The method of accomplishing this decrease will depend on the control mode, as previously described with respect to this fault.

Open circuit fault OC5, an open diode, may be detected by monitoring current when there is an attempt to turn off the switches at the end of a phase conduction, whereupon the switch requiring the diode for protection will be forced by the inductive energy to conduct for a longer time. The amelioration is provided by early turn-off of the affected switch to reduce the current, and thus the energy level, to or near zero before the switch is opened. Unfortunately, the condition is not easily detectable in a constantly operating machine until the dangerous condition is created. Thus, as a practical matter in such operation, continued operation at a lower level will probably not be a realistic option except at power levels that are already low. At higher levels, the circuit breaker will probably shut down the phase to protect the switch before the current level can be adjusted. In intermittent machine operation, of course, the phase may be tested when use of the machine is not required, in order to detect the condition and adjust the current level for continued use of the phase during following periods of machine use.

Open circuit fault OC7, in which the power capacitor is open circuited, may be detected by monitoring current or voltage ripple over time. The phase current is turned off early, with one of switches 12 and 13 being turned off first and the other kept conducting until the phase current reaches zero to avoid regeneration. It is preferred that current level be reduced to help ensure achievement of this requirement.

During the operation of the machine as described herein, certain circuit faults, which have already been identified, may occur that do not permit continued operation of the affected phase and which, in at least some cases, indicate that immediate shut-down of the phase is desirable. If any of these faults are detected, control 30 will shut down the phase in step 204 as previously described. But it may be that one or more faults requiring immediate shut-down of the phase may take more time for control 30 to identify and respond to than is advisable to prevent component damage. For these, a circuit breaker 36 may be provided in each phase as shown in FIG. 1. Typically, damage to components is produced by electric currents that are too high. Such currents typically begin as soon as the switches turn on and typically rise quickly to their damaging levels. Even if control 30 is not sufficiently fast to identify and act on these faults, the appropriate circuit breaker 36, designed to look for the current levels and rise times typical of component damaging faults, will act independently of control 30 to shut down the phase. Thus, only the faults in which continued operation is possible and desirable will actually permit continued operation of the machine.

The invention claimed is:

1. A method of operating a multi-pole, switched reluctance, electrical machine having a plurality of phase winding circuits, each of the phase winding circuits having a pair of terminals for connection across an electric power supply to provide electric current through phase windings therein, a pair of electronic switches connected to the terminals for controlling electrical communication between the terminals thereof and the electric power supply, and a plurality of free-wheeling diodes creating inductive energy dissipating current paths, the method comprising the steps:

activating the pair of switches of one of the phase winding circuits to provide electric power to the phase windings thereof through a motor movement distance wherein inductance of the phase windings thereof is increasing;

monitoring at least one motor parameter to detect at least one predetermined circuit fault comprising one of a short circuit and an open circuit of an element within the one of the phase winding circuits; and responsive to detection of the predetermined circuit fault, continuing operation of the one of the phase winding circuits with at least a continuing one of the pair of electronic switches, the step of activating the pair of switches being modified by at least one of the two following steps:

(1) ending the activation of the continuing one of the pair of electronic switches at a fault motor position prior to a no-fault motor position at which the activation would be ended in the absence of detection of the predetermined circuit fault, and (2) activating the continuing one of the electronic switches to control maximum current through the phase winding circuit to a fault maximum current level less than a no-fault maximum current level permitted in the absence of detection of the predetermined circuit fault.

2. The method of claim 1 wherein the step of activating the pair of switches is modified by the step of ending the activation of the continuing one of the pair of electronic switches at a fault motor position prior to a no-fault motor position at which the activation would be ended in the absence of detection of the predetermined circuit fault.

3. The method of claim 2 wherein the fault motor position is prior to the no-fault motor position by a motor movement distance that is a function of motor speed.

4. The method of claim 1 wherein the step of activating the pair of switches is modified by the step of activating the continuing one of the electronic switches to control maximum current through the phase winding circuit to a fault maximum current level less than a no-fault maximum current level permitted in the absence of detection of the predetermined circuit fault.

5. The method of claim 4 wherein the fault maximum current level is less than the no-fault maximum current level by a current level difference that is a function of motor speed.

6. The method of claim 4 wherein the maximum current through the phase winding circuit is lowered by increasing a switching frequency of one of the electronic switches in a hysteresis current control mode.

7. The method of claim 1 wherein:
the step of activating the pair of switches comprises:
when no circuit fault is detected, activating a first one of the electronic switches in a continuously conducting condition and activating a second one of the electronic switches alternately between conducting and non-conducting conditions for control of current level through the phase winding circuit, and
alternatively, when the predetermined circuit fault is detected and comprises a short circuit of the second one of the electronic switches, activating the first one of the electronic switches alternately between conducting and non-conducting conditions for control of current level through the phase winding circuit.

8. The method of claim 1 wherein the step of monitoring at least one motor parameter to detect at least one predetermined circuit fault comprising one of a short circuit and an open circuit of an element within the one of the phase winding circuits further comprises distinguishing between at least two of such circuit faults and the step of continuing operation of the one of the phase winding circuits responsive to detection of the predetermined circuit fault further comprises selecting between predetermined modification parameters associated with the at least two of such circuit faults.

9. The method of claim 1 wherein the step of monitoring at least one motor parameter to detect at least one predetermined circuit fault further comprises measuring total current flow through the phase windings of the phase winding circuit.

10. Electric control apparatus for a multi-pole, switched reluctance electrical machine having a plurality of phase winding circuits, each of the phase winding circuits having a plurality of phase windings therein between a pair of winding connection terminals, the apparatus comprising, in combination:
for each of the phase winding circuits, a phase control circuit having pair of power terminals providing connection points for application of externally sourced electrical power thereto and a pair of electronic switches in series between the power terminals, the phase windings of the associated phase winding circuit being connected between the pair of electronic switches so that the pair of electronic switches control application of the externally sourced electric power to, and thus the current through, the phase windings;
in each of the phase winding circuits, a plurality of free-wheeling diodes creating inductive energy dissipating current paths therein for protection of the electronic switches; and
a switch control apparatus connected to control terminals of the electronic switches, the switch control apparatus comprising:

means for activating the pair of electronic switches of at least one of the phase winding circuits to provide electric power to the one of the phase winding circuits through a motor movement distance wherein inductance of the phase windings thereof is increasing;
means for monitoring at least one motor parameter to detect at least one predetermined circuit fault comprising one of a short circuit and an open circuit of an element within the one of the phase winding circuits; and
means responsive to detection of the predetermined circuit fault for continuing operation of the one of the phase winding circuits with at least a continuing one of the pair of electronic switches and with at least one of the two following modifications:
(1) ending the activation of the continuing one of the pair of electronic switches at a fault motor position prior to a no-fault motor position at which the activation would be ended in the absence of detection of the predetermined circuit fault, and
(2) activating the continuing one of the pair of electronic switches to control maximum current through the one of the phase winding circuits to a fault maximum current level less than a no-fault maximum current level permitted in the absence of detection of the predetermined circuit fault.

11. The electric control apparatus of claim 10 wherein the means for monitoring the at least one motor parameter comprises a current sensor connected in series with the phase windings of the phase winding circuit so as to measure total current flow therethrough.

12. The electric control apparatus of claim 11 in which the current sensor is connected in series between the phase windings and a selected one of the pair of electronic switches.

13. The electronic control apparatus of claim 12 wherein, when no fault is detected, a first one of the pair of electronic switches is activated in a continuously conducting condition through the motor movement distance wherein inductance of the phase windings thereof is increasing for control of current level through the phase winding circuit and a second one of the pair of electronic switches is activated alternately between conducting and non-conducting conditions through the motor movement distance wherein inductance of the phase windings thereof is increasing for control of current level through the phase winding circuit, and the selected one of the pair of electronic switches is the first one of the pair of electronic switches.

14. The electronic control apparatus of claim 12 wherein, when no fault is detected, a first one of the pair of electronic switches is activated in a continuously conducting condition through the motor movement distance wherein inductance of the phase windings thereof is increasing for control of current level through the phase winding circuit and a second one of the pair of electronic switches is activated alternately between conducting and non-conducting conditions through the motor movement distance wherein inductance of the phase windings thereof is increasing for control of current level through the phase winding circuit, and the selected one of the pair of electronic switches is the second one of the pair of electronic switches.

* * * * *